US011367626B2

(12) United States Patent
Tomikawa et al.

(10) Patent No.: US 11,367,626 B2
(45) Date of Patent: Jun. 21, 2022

(54) ELECTRONIC COMPONENT-INCORPORATING SUBSTRATE

(71) Applicant: TDK CORPORATION, Tokyo (JP)

(72) Inventors: Mitsuhiro Tomikawa, Tokyo (JP); Kazuhiro Yoshikawa, Tokyo (JP); Koichi Tsunoda, Tokyo (JP); Kenichi Yoshida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 170 days.

(21) Appl. No.: 16/499,501

(22) PCT Filed: Mar. 16, 2018

(86) PCT No.: PCT/JP2018/010552
§ 371 (c)(1),
(2) Date: Sep. 30, 2019

(87) PCT Pub. No.: WO2018/180628
PCT Pub. Date: Oct. 4, 2018

(65) Prior Publication Data
US 2020/0043751 A1 Feb. 6, 2020

(30) Foreign Application Priority Data
Mar. 31, 2017 (JP) .............................. JP2017-070578

(51) Int. Cl.
*H01L 21/48* (2006.01)
*H05K 1/16* (2006.01)
(Continued)

(52) U.S. Cl.
CPC .......... *H01L 21/4857* (2013.01); *H05K 1/16* (2013.01); *H05K 1/18* (2013.01); *H05K 1/181* (2013.01);
(Continued)

(58) Field of Classification Search
CPC ............ H05K 1/16; H05K 1/18; H05K 1/181; H05K 1/185; H05K 3/4015; H05K 3/4682; H01L 21/4857
See application file for complete search history.

(56) References Cited

U.S. PATENT DOCUMENTS 8,544,167 B2 * 10/2013 Morita .................... H01L 24/83
29/832
2008/0211143 A1 9/2008 Morita
2016/0322294 A1 11/2016 Kobayashi et al.

FOREIGN PATENT DOCUMENTS

JP 2010-251530 A 11/2010
JP 2010251530 A * 11/2010
(Continued)

OTHER PUBLICATIONS

May 29, 2018 International Search Report issued in International Patent Application No. PCT/JP2018/010552.
(Continued)

*Primary Examiner* — Carl J Arbes
(74) *Attorney, Agent, or Firm* — Oliff PLC

(57) ABSTRACT

A first insulating layer, a conductor layer included on a first main surface, an electronic component included on the first main surface and a second insulating layer stacked on the first insulating layer are included, a stacking direction of the first insulating layer and the second insulating layer is the same as a stacking direction of a first electrode layer, a second electrode layer, and the dielectric layer in the electronic component, and a height position of a main surface of the electronic component on an opposite side from a side of the first main surface is different from a height position of a main surface of the conductor layer adjacent to the electronic component on an opposite side from a side of the first main surface in the stacking direction.

6 Claims, 11 Drawing Sheets

(51) Int. Cl.
  *H05K 3/40* (2006.01)
  *H05K 3/46* (2006.01)
  *H05K 1/18* (2006.01)
(52) U.S. Cl.
  CPC ........... *H05K 1/185* (2013.01); *H05K 3/4015* (2013.01); *H05K 3/4682* (2013.01)

(56) References Cited

FOREIGN PATENT DOCUMENTS

| | | |
|---|---|---|
| JP | 2014-045092 A | 3/2014 |
| JP | 2016-207957 A | 12/2016 |
| KR | 10-2008-0059098 A | 6/2008 |
| KR | 10-2015-0101722 A | 9/2015 |

OTHER PUBLICATIONS

Oct. 10, 2019 International Preliminary Report on Patentability issued in International Patent Application No. PCT/JP2018/010552.

* cited by examiner

ELECTRONIC COMPONENT-INCORPORATING SUBSTRATE

TECHNICAL FIELD

The present invention relates to an electronic component-incorporating substrate.

BACKGROUND ART

With miniaturization of an electronic product, there is a demand for miniaturization of an electronic component-incorporating substrate, including reduction in profile. For example, Patent Literature 1 shows a configuration in which a chip capacitor is accommodated as an electronic component in a wiring board.

CITATION LIST

Patent Literature

Patent Literature 1: Japanese Unexamined Patent Publication No. 2016-207957

SUMMARY OF INVENTION

Technical Problem

However, when a thin film electronic component such as a thin film capacitor instead of a chip capacitor is attempted to be incorporated in the substrate as described above, the following problem occurs. That is, since the thin film capacitor has lower rigidity than that of the chip capacitor, there is concern that an external force generated when the electronic component-incorporating substrate is handled may act on the electronic component to deform the electronic component.

The invention has been made in view of the above, and an object of the invention is to provide an electronic component-incorporating substrate capable of inhibiting an electronic component from receiving an influence of an external force.

Solution to Problem

To achieve the object, an electronic component-incorporating substrate according to an aspect of the invention includes a first insulating layer, a conductor layer provided on a first main surface corresponding to a main surface of the first insulating layer on one side, an electronic component provided on the first main surface of the first insulating layer, in which a pair of electrode layers and a dielectric layer are stacked, and a second insulating layer stacked on the first insulating layer, in which a stacking direction of the first insulating layer and the second insulating layer is the same as a stacking direction of the electrode layers and the dielectric layer in the electronic component, and a height position of a main surface of the electronic component on an opposite side from a side of the first main surface is different from a height position of a main surface of the conductor layer adjacent to the electronic component on an opposite side from a side of the first main surface in the stacking direction.

In the electronic component-incorporating substrate, when an external force is received, in particular, when an external force is received such that a position shift occurs between the main surface on one side and the main surface on the other side along a main surface direction of the electronic component-incorporating substrate, the external force may propagate along the conductor layer on the first insulating layer. On the other hand, by having a configuration in which the height position of the main surface of the electronic component on one side is different from the height position of the main surface in the conductor layer adjacent to the electronic component, it is possible to inhibit the electronic component from being affected by the external force propagating along the conductor layer. Therefore, according to the electronic component-incorporating substrate, the electronic component can be inhibited from being affected by an external force.

Here, it is possible to adopt an aspect in which the electronic component is provided on an adhesive layer provided on the first main surface of the first insulating layer.

As described above, when the electronic component is provided on the adhesive layer on the first main surface of the first insulating layer, in a case in which the electronic component-incorporating substrate receives an external force, the external force received by the electronic component can be mitigated by the adhesive layer. Therefore, according to the electronic component-incorporating substrate, it is possible to further inhibit the electronic component from being affected by the external force.

In addition, it is possible to adopt an aspect in which a height position of a main surface of the electronic component on the side of the first main surface is different from a height position of a main surface of the conductor layer adjacent to the electronic component on the side of the first main surface in the stacking direction.

By having a configuration in which the height position of the main surface of the electronic component on the side of the first main surface is different from the height position of the main surface of the conductor layer adjacent to the electronic component on the side of the first main surface as described above, it is possible to more effectively inhibit the electronic component from being affected by the external force propagating along the conductor layer.

In addition, it is possible to adopt an aspect in which a thickness of the conductor layer is substantially uniform.

When the thickness of the conductor layer is substantially uniform as described above, an external force propagating along an extending direction of the conductor layer is inhibited from dispersing in another direction. Thus, there is a possibility that the electronic component may be greatly affected by the external force. However, by controlling the height position of the main surface as described, it is possible to inhibit the electronic component from being affected by the external force.

In addition, it is possible to adopt an aspect in which a part of the electrode layer of the electronic component is connected to the conductor layer by a conductive paste.

When the conductive paste connecting the electrode layer of the electronic component to the conductor layer is provided as described above, layout of wiring can be flexibly changed. In addition, when layout of wiring can be flexibly changed, for example, arrangement of the via conductor, etc. used for wiring can be flexibly changed.

Advantageous Effects of Invention

According to the invention, an electronic component-incorporating substrate capable of inhibiting an electronic component from receiving an influence of an external force is provided.

DESCRIPTION OF EMBODIMENTS

Hereinafter, modes for carrying out the invention will be described in detail with reference to accompanying drawings. Incidentally, in the description of the drawings, the same element will be denoted by the same reference symbol, and a repeated description will be omitted.

Figure 1:
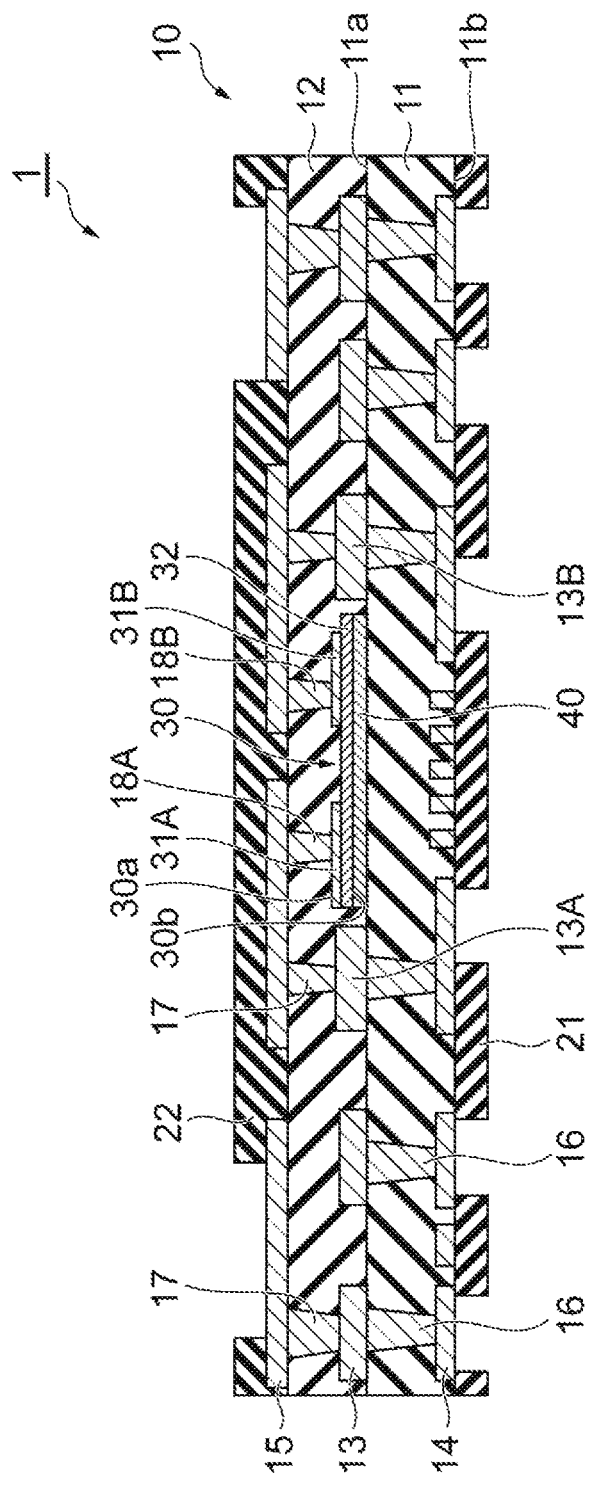
FIG. 1 is a cross-sectional view schematically illustrating an electronic component-incorporating substrate according to an embodiment of the invention.

FIG. 1 is a cross-sectional view schematically illustrating an electronic component-incorporating substrate according to an embodiment of the invention. For example, an electronic component-incorporating substrate 1 illustrated in FIG. 1 is a substrate used for an electronic device such as a communication terminal. As illustrated in FIG. 1, the electronic component-incorporating substrate 1 includes a substrate 10 and an electronic component 30 incorporated in the substrate 10. A statement that the electronic component 20 is "incorporated in" the substrate 10 refers to a state in which the electronic component 20 is not exposed from a main surface of the substrate 10. The electronic component 30 is a component that functions as a capacitor, etc.

The substrate 10 includes a first insulating layer 11 and a second insulating layer 12. The first insulating layer 11 and the second insulating layer 12 are stacked in a stacking direction (thickness direction). For example, the first insulating layer 11 and the second insulating layer 12 are made of an insulating material such as an epoxy resin, a polyimide resin, an acrylic resin, or a phenolic resin. For example, an entire thickness of the substrate 10 can be set to about 40 µm to 300 µm. In addition, each of thicknesses of the first insulating layer 11 and the second insulating layer 12 can be set to about 15 µm to 100 µm. Incidentally, the total thickness of the substrate 10, the thickness of the first insulating layer 11, and the thickness of the second insulating layer 12 are not particularly limited.

In addition, the substrate 10 includes a first conductor layer 13 interposed between the first insulating layer 11 and the second insulating layer 12, and a second conductor layer 14 and a third conductor layer 15 provided on the main surface of the substrate 10. For example, the first conductor layer 13, the second conductor layer 14, and the third conductor layer 15 are made of a conductive material such as copper (Cu).

The first conductor layer 13 is formed on a first main surface 11a of the first insulating layer 11 on which the second insulating layer 12 is stacked. Therefore, the first main surface 11a of the first insulating layer 11 is flat, and the first conductor layer 13 is provided thereon.

The second conductor layer 14 is provided so that a conductor portion is exposed on a second main surface 11b of the first insulating layer 11 on the opposite side from the first main surface 11a. In the electronic component-incorporating substrate 1 illustrated in FIG. 1, a surface of the second conductor layer 14 forms a flat surface together with the second main surface 11b. However, the second conductor layer 14 may be provided to protrude from the second main surface 11b. A part of the surface of the second conductor layer 14 may be covered with an insulating material 21 such as a solder resist.

The third conductor layer 15 is provided so that a conductor portion is exposed on a main surface on the opposite side from a main surface on the first insulating layer 11 side in the second insulating layer 12. In the electronic component-incorporating substrate 1 illustrated in FIG. 1, a surface of the third conductor layer 15 protrudes from a main surface of the second insulating layer 12. However, the surface may form a flat surface together with the main surface of the second insulating layer 12. A part of the surface of the third conductor layer 15 may be covered with an insulating material 22 such as a solder resist.

The first conductor layer 13, the second conductor layer 14, and the third conductor layer 15 have substantially uniform thicknesses, respectively. The fact that the conductor layers have substantially uniform thicknesses means that a fluctuation range of the thicknesses is within 30%. The thicknesses of the first conductor layer 13, the second conductor layer 14, and the third conductor layer 15 are set to about 5 µm to 20 µm.

In addition, in the first insulating layer 11, an opening penetrating therethrough in the thickness direction is provided, and a via conductor 16 connecting between the first conductor layer 13 and the second conductor layer 14 is provided. Similarly, in the second insulating layer 12, an opening penetrating therethrough in the thickness direction is provided, and a via conductor 17 connecting between the first conductor layer 13 and the third conductor layer 15 is provided.

The electronic component 30 is provided to be embedded in the second insulating layer 12 on the first main surface 11a of the first insulating layer 11. The electronic component 30 includes a first electrode layer 31A and a second electrode layer 31B, which are a pair of electrode layers, and a dielectric layer 32. The electronic component 30 has a stacked structure with the dielectric layer 32 and the pair of electrode layers, and a stacking direction thereof is the same as the stacking direction of the first insulating layer 11 and the second insulating layer 12 in the electronic component-incorporating substrate 1.

In the present embodiment, the first electrode layer 31A and the second electrode layer 31B, which are a pair of electrode layers, are provided on a main surface of the dielectric layer 32 on one side (a side farther from the first insulating layer 11). That is, the first electrode layer 31A and the second electrode layer 31B are stacked at mutually different positions on the dielectric layer 32. As a result, a first main surface 30a which is a main surface of the electronic component 30 on one side is formed by main surfaces of the first electrode layer 31A and the second electrode layer 31B, and a second main surface 30b which is a main surface on the other side is formed by a main surface of the dielectric layer 32 on the other side (a side closer to the first insulating layer 11). Incidentally, the first electrode layer 31A and the second electrode layer 31B of the electronic component 30 may be provided to interpose the dielectric layer 32 therebetween. In addition, it is possible to employ a multilayer structure in which any of the electrode layers and the dielectric layer are alternately stacked a plurality of times.

A total thickness of the electronic component 30 is about 1 µm to 150 µm. In addition, thicknesses of the first electrode layer 31A and the second electrode layer 31B can be set to about 0.5 µm to 50 µm, and a thickness of the dielectric layer 32 can be set to about 0.5 µm to 100 µm.

A material whose main component is nickel (Ni), copper (Cu), aluminum (Al), platinum (Pt), an alloy containing any of these metals, or an intermetallic compound is favorably used as a material of the first electrode layer 31A and the second electrode layer 31B. However, the material of the first electrode layer 31A and the second electrode layer 31B is not particularly limited as long as the material is a conductive material. Incidentally, being the "main component" means that a proportion of the component is 50 mass % or more. In addition, as an aspect of the first electrode layer 31A and the second electrode layer 31B, in addition to the case of forming an alloy or an intermetallic compound, the case of a structure of a stacked body of two or more types is included. Incidentally, when pure Ni is used as the first electrode layer 31A and/or the second electrode layer 31B, the purity of Ni is preferably 99.99% or more. Further, in the case of an alloy containing Ni, a metal contained as a metal other than Ni favorably corresponds to at least one selected from the group consisting of platinum (Pt), palladium (Pd), iridium (Ir), rhodium (Rh), ruthenium (Ru), osmium (Os), rhenium (Re), tungsten (W), chromium (Cr), tantalum (Ta), Silver (Ag), and copper (Cu).

Incidentally, the first electrode layer 31A and the second electrode layer 31B of the electronic component 30 are electrically connected to another conductor layer, etc. through a via conductor, etc. In the case of the electronic component-incorporating substrate 1, the first electrode layer 31A and the second electrode layer 31B are electrically connected to the third conductor layer 15 through via conductors 18A and 18B penetrating the second insulating layer 12, respectively.

The dielectric layer 32 is made of a perovskite dielectric material. Here, examples of the perovskite dielectric material in the present embodiment include a dielectric material (ferroelectric material) having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, or $Pb(Zr_xTi_{1-x})O_3$, a composite perovskite relaxor type ferroelectric material represented by $Pb(Mg_{1/3}Nb_{2/3})O_3$, etc. Here, in the perovskite structure and the perovskite relaxor type dielectric material, a ratio of A site to B site is normally an integer ratio. However, the ratio may be intentionally shifted from the integer ratio to improve a characteristic. Incidentally, to control a characteristic of the dielectric layer 32, an additive material may be appropriately contained in the dielectric layer 32 as an accessory component.

The electronic component 30 is stacked on the first main surface 11a of the first insulating layer 11 via an adhesive layer 40. The adhesive layer 40 is not particularly limited as long as the electronic component 30 can be fixed to the first insulating layer 11. For example, it is possible to use a resin before heat curing (prepreg, a filler-containing composite material, etc.), an adhesive (an adhesive sheet, paste containing metal powder, etc.), etc. When the above-described material is used as the adhesive layer 40, the adhesive layer 40 is more elastic than the electronic component 30. A thickness of the adhesive layer 40 can be set to about 0.5 µm to 30 µm.

Figure 2:
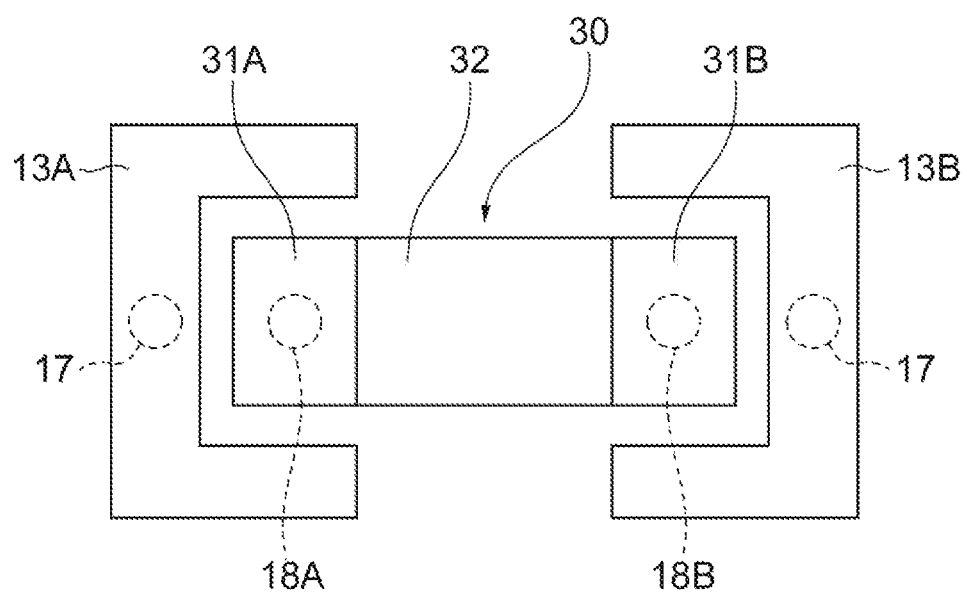
FIG. 2 is a plan view of a vicinity of an electronic component of the electronic component-incorporating substrate.

The electronic component 30 is disposed on the first main surface 11a of the first insulating layer 11 similarly to the first conductor layer 13 and disposed apart from the first conductor layer 13. FIG. 2 is a plan view schematically illustrating arrangement of the electronic component 30 and the first conductor layer 13 in plan view. As illustrated in FIG. 2, the first conductor layer 13 (conductor layers 13A and 13B) is provided to surround and be spaced apart from the first electrode layer 31A, the second electrode layer 31B, and the dielectric layer 32 of the electronic component 30. In the electronic component-incorporating substrate 1, the second insulating layer 12 is disposed between the electronic component 30 and the first conductor layer 13. Therefore, insulation is ensured between the electronic component 30 and the first conductor layer 13.

In the case of the electronic component-incorporating substrate 1, the first electrode layer 31A is connected to the first conductor layer 13 (conductor layer 13A) on the first electrode layer 31A side via the via conductor 18A, the third conductor layer 15 (conductor layer 15A) and a via conductor 17. In addition, the second electrode layer 31B is connected to the first conductor layer 13 (conductor layer 13B) on the second electrode layer 31B side via the via conductor 18B, the third conductor layer 15 (conductor layer 15B) and a via conductor 17. As illustrated in FIG. 2, both the conductor layer 13A which is the first conductor layer 13 on the first electrode layer 31A side and the conductor layer 13B which is the first conductor layer 13 on the second electrode layer 31B side have a concave shape, and are in a state in which the electronic component 30 enters a concave portion of the conductor layer. In this way, when the first conductor layer 13 is disposed to surround the electronic component 30, a periphery of the electronic component 30 on the first insulating layer 11 can be effectively used as a conductor layer. Incidentally, the electronic component 30 and the first conductor layer 13 are preferably separated by 3 µm or more in order to ensure insulation.

In addition, in FIG. 2, the via conductors 18A and 18B and the via conductors 17 are indicated by broken lines. The via conductors 18A and 18B and the via conductors 17 are provided above the electrode layer or the conductor layer to which each of the via conductors is connected. When such a configuration is adopted, insulation between adjacent via conductors is ensured by the second insulating layer 12.

Returning to FIG. 1, the first main surface 30a of the electronic component 30 is higher than an upper surface of the first conductor layer 13 (main surface on the third conductor layer 15 side). In addition, since the electronic component 30 is stacked on the first main surface 11a of the first insulating layer via the adhesive layer 40, the second main surface 30b is higher than a lower surface of the first conductor layer 13, that is, the first main surface 11a of the insulating layer 11. As described above, in the electronic component-incorporating substrate 1, height positions of the first main surface 30a and the second main surface 30b of the electronic component 30 are different from height positions of a pair of main surfaces of the first conductor layer 13 when viewed in the thickness direction (stacking direction).

Figure 3:
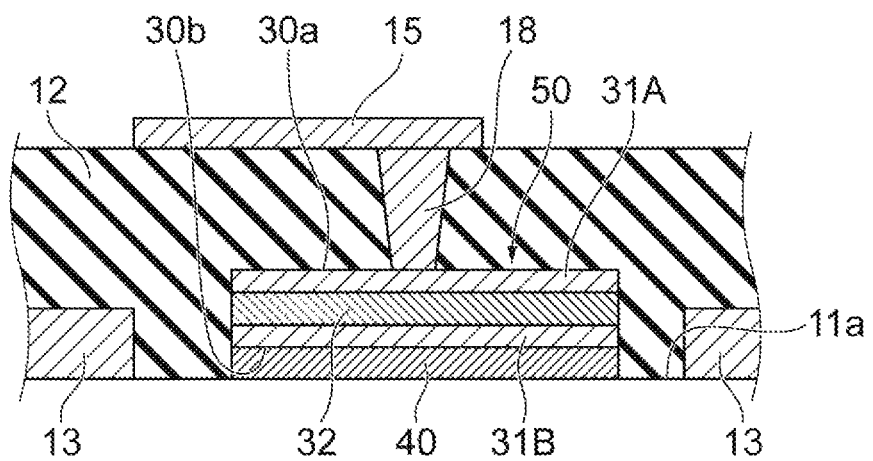
FIG. 3 is an enlarged view of a vicinity of the electronic component of the electronic component-incorporating substrate.

FIG. 3 is an enlarged view of a vicinity of the electronic component of the electronic component-incorporating substrate. However, unlike the electronic component 30 illustrated in FIG. 1, etc., an electronic component 50 of the electronic component-incorporating substrate illustrated in FIG. 3 is provided so that the first electrode layer 31A and the second electrode layer 31B interpose the dielectric layer 32 therebetween. That is, the electronic component 50 of the electronic component-incorporating substrate illustrated in FIG. 3 is different from the electronic component 30 in that the second electrode layer 31B is disposed on the first main surface 11a side of the first insulating layer (not illustrated in FIG. 3, see FIG. 1, etc.). In this case, only the via conductor 18A penetrating the second insulating layer 12 is provided, and the first electrode layer 31A and the third conductor layer 15 are electrically connected via the via conductor 18A. Incidentally, with regard to the second electrode layer 31B, a conductor wiring which connects the second electrode layer 31B and the conductor layer to each other is provided in a region not illustrated in the drawing.

In FIG. 3, the first main surface 30a of the electronic component 50 is higher than the upper surface of the first conductor layer 13 (the main surface on the third conductor layer 15 side). In addition, since the electronic component 50 is stacked on the first main surface 11a of the first insulating layer via the adhesive layer 40, the second main surface 30b is higher than the lower surface of the first conductor layer 13, that is, the first main surface 11a of the insulating layer 11.

As illustrated in FIG. 1, FIG. 3, etc., the electronic component-incorporating substrate 1 according to the present embodiment is characterized in that the height position of the main surface of the electronic component is different from the height position of the main surface of the adjacent first conductor layer 13 when viewed in the thickness direction. As a result, when an external force is applied to the electronic component-incorporating substrate 1, the electronic component can be prevented from receiving an influence of the external force. This point will be described below.

Figure 4:
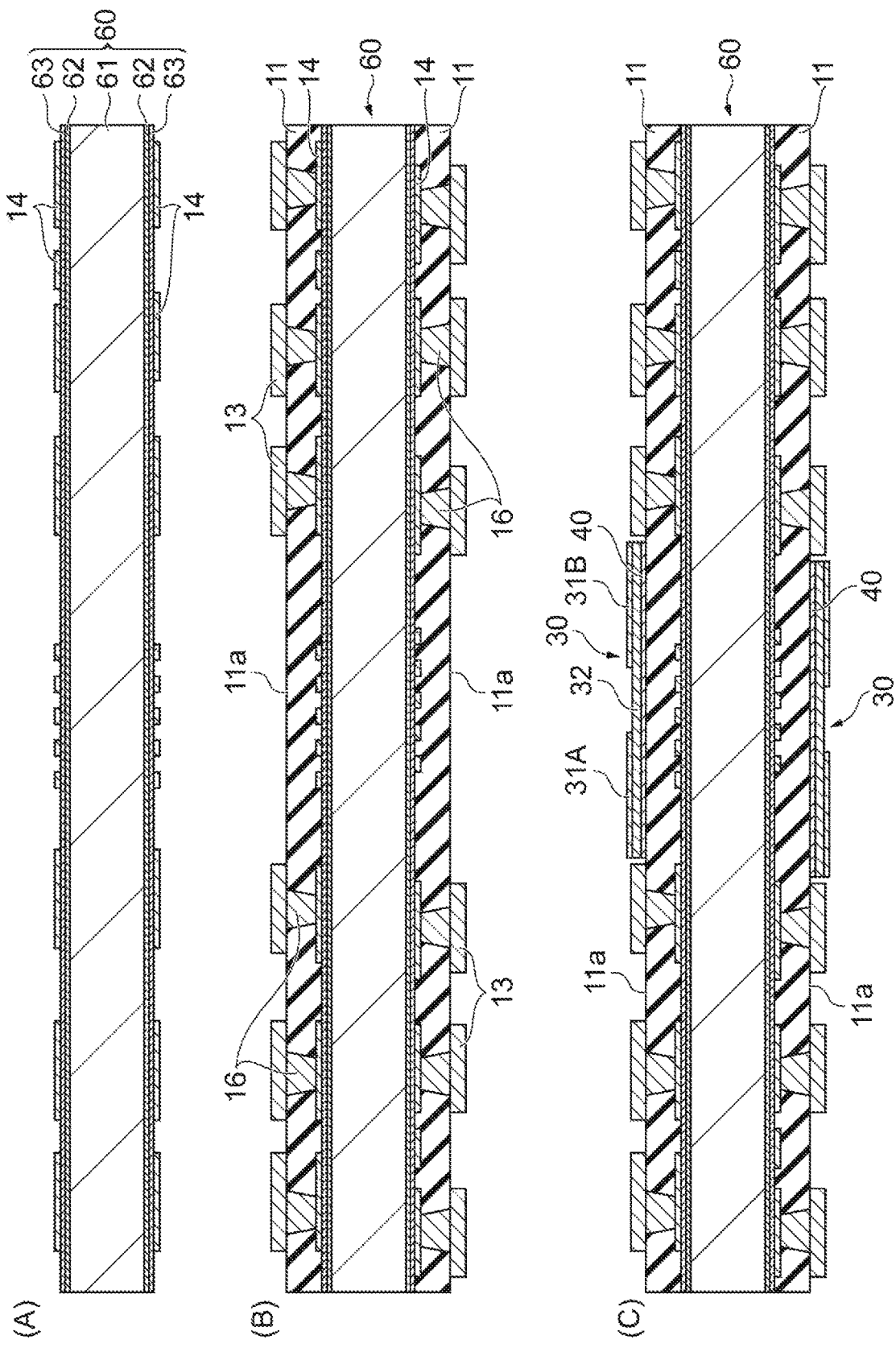
FIG. 4 is a diagram for description of a method of manufacturing the electronic component-incorporating substrate.
Figure 5:
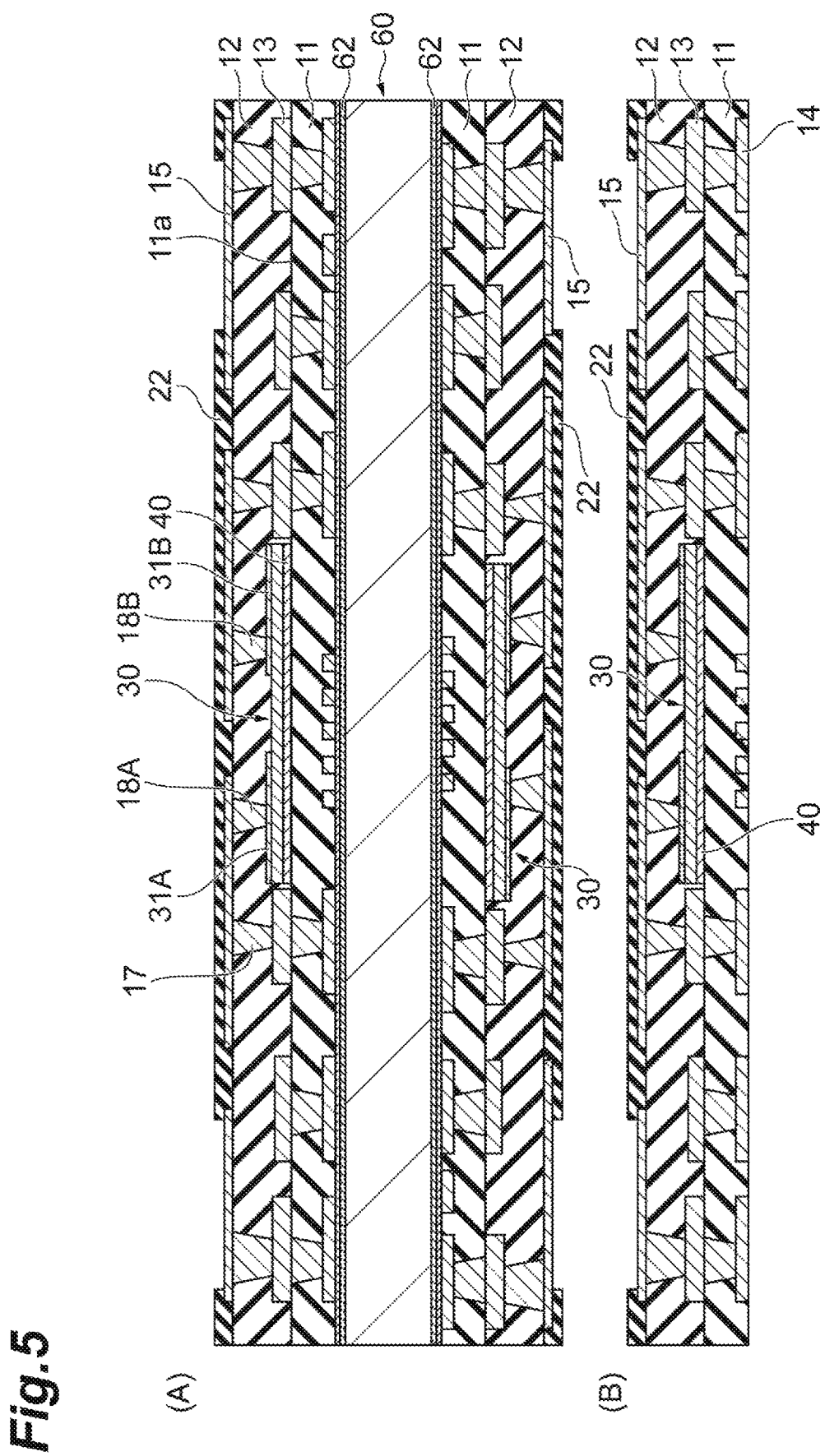
FIG. 5 is a diagram for description of a method of manufacturing the electronic component-incorporating substrate.

Next, a method of manufacturing the electronic component-incorporating substrate 1 will be described with reference to FIG. 4 and FIG. 5. The method of manufacturing the electronic component-incorporating substrate 1 described in the present embodiment is a method of simultaneously manufacturing two electronic component-incorporating substrates on a pair of main surfaces of a carrier-included copper foil. However, the electronic component-incorporating substrates may be manufactured on only one main surface.

First, as illustrated in FIG. 4(A), a carrier-included copper foil 60 is prepared, and the second conductor layer 14 having a predetermined pattern is formed in the carrier-included copper foil 60. The carrier-included copper foil 60 is obtained by stacking ultrathin copper foils 63 on both main surfaces of a substrate 61 via release layers 62. A method of forming the second conductor layer 14 is not particularly limited. For example, the second conductor layer 14 may be formed by performing patterning after forming a conductor layer on the ultrathin copper foil 63. Incidentally, in a subsequent manufacturing process, a similar treatment is performed on both surfaces of the carrier-included copper foil 60. However, performing the similar treatment on the both surfaces may not be described in some cases.

Subsequently, as illustrated in FIG. 4(B), the first insulating layer 11 is stacked on the second conductor layer 14. Furthermore, an opening is provided at a predetermined position of the first insulating layer 11 using a laser, etc. to introduce a conductor material, thereby forming the via conductor 16. Furthermore, the first conductor layer 13 having a predetermined wiring pattern is formed on the first main surface 11a of the first insulating layer 11.

Thereafter, as illustrated in FIG. 4(C), the adhesive layer 40 is formed on the first main surface 11a of the first insulating layer 11, and the electronic component 30 is stacked on the adhesive layer 40. The electronic component 30 is stacked on the adhesive layer 40 in a state in which the first electrode layer 31A, the second electrode layer 31B, and the dielectric layer 32 are processed into desired shapes.

Subsequently, the second insulating layer 12 is stacked to cover all the first main surface 11a of the first insulating layer 11, the first conductor layer 13, and the electronic component 30. Then, an opening is provided at a predetermined position of the second insulating layer 12 using a laser, etc. to introduce a conductor material, thereby forming the via conductors 17, 18A, and 18B. In addition, the third conductor layer 15 having a predetermined wiring pattern is formed on the main surface of the second insulating layer 12. Furthermore, the insulating material 22 is provided at a predetermined position on surfaces of the second insulating layer 12 and the third conductor layer 15. As a result, as illustrated in FIG. 5(A), a stacked body formed by stacking the first insulating layer 11 and the second insulating layer 12 and incorporating the electronic component 30 therein is obtained on both surfaces of the carrier-included copper foil 60.

Subsequently, in the release layer 62 of the carrier-included copper foil 60, the substrate 61 and the ultrathin copper foil 63 of the carrier-included copper foil 60 are separated from each other. As a result, the stacked body formed by stacking the first insulating layer 11 and the second insulating layer 12 and incorporating the electronic component 30 therein is separated from the substrate 61. Thereafter, the ultrathin copper foil 63 attached to the surfaces of the first insulating layer 11 and the second conductor layer 14 is removed by polishing, etc. As a result, as illustrated in FIG. 5(B), the first insulating layer 11 and the second conductor layer 14 are exposed on the lower surface side.

Thereafter, when the insulating material 21 is provided at a predetermined position on the surfaces of the first insulating layer 11 and the second conductor layer 14, the electronic component-incorporating substrate 1 illustrated in FIG. 1 is obtained.

In the electronic component-incorporating substrate 1 according to the present embodiment, as described above, when the electronic component-incorporating substrate 1 is viewed in the thickness direction (stacking direction), the height positions of the first main surface 30a and the second main surface 30b of the electronic component 30 are different from the height positions of the pair of main surfaces of the adjacent first conductor layer 13. More specifically, the first main surface 30a of the electronic component 30 is higher than the upper main surface of the first conductor layer 13 (on the third conductor layer 15 side), and the second main surface 30b of the electronic component 30 is higher than the lower main surface of the first conductor layer 13 (on the second conductor layer 14 side) (that is, corresponding to the first main surface 11a of the first insulating layer 11). As a result, even when the electronic component-incorporating substrate 1 receives an external force, the electronic component 30 can be prevented from being affected by the external force and damaged.

The electronic component-incorporating substrate 1 according to the present embodiment is a device whose profile has been reduced in accordance with a recent demand for reducing a profile of an electronic device. That is, the profile as the electronic component-incorporating substrate 1 is significantly smaller than that of a conventional electronic component-incorporating substrate. For this reason, the electronic component-incorporating substrate 1 is easily affected by an external force. An influence on the electronic component-incorporating substrate 1 varies depending on the position at which the electronic component-incorporating substrate 1 receives an external force, the direction of the external force, and the magnitude thereof. However, an area in which the electronic component 30 is incorporated and a periphery thereof are places where the influence of the external force tends to be concentrated. In particular, in a case in which the first insulating layer 11 and the second insulating layer 12 are stacked and the first conductor layer 13 is formed in a vicinity of an interface thereof as in the electronic component-incorporating substrate 1, when a force of shifting the interface between the first insulating layer 11 and the second insulating layer 12 is received, the electronic component 30 disposed at the interface between the first insulating layer 11 and the second insulating layer 12 is easily affected. More specifically, when an external force is received such that a position shift occurs between the main surface on one side and the main surface on the other side along a main surface direction of the electronic component-incorporating substrate 1, a part between the first main surface 11a of the first insulating layer 11 and the main surface of the second insulating layer 12 facing the first main surface 11a is most susceptible to an influence in the electronic component-incorporating substrate 1, and the external force is received such that a relative position thereof changes. As a result, the first conductor layer 13 provided on the first main surface 11a of the first insulating layer 11 receives the external force. Then, the external force is propagated along the first main surface 11a via the first conductor layer 13, and the electronic component 30 is considered to be affected. In many cases, the first conductor layer 13 is higher in rigidity than the first insulating layer 11 and the second insulating layer 12 in the vicinity thereof. In this case, it is considered that the ability to propagate the external force is particularly high. Here, when the electronic component 30 and the adjacent first conductor layer 13 are at the same height position when viewed in the stacking direction, the external force propagated by the first conductor layer 13 is propagated to the electronic component 30. The electronic component 30 has a structure having the dielectric layer 32, and thus has lower rigidity than that of the first conductor layer 13 and is likely to be damaged when the electronic component 30 is affected by an external force. In particular, when a stacking direction of the first electrode layer 31A, the second electrode layer 31B, and the dielectric layer 32 is the same as the stacking direction of the first insulating layer 11 and the second insulating layer 12 as in the electronic component 30 according to the present embodiment, there is a possibility that the electronic component 30 may be greatly affected by the external force.

On the other hand, in the electronic component-incorporating substrate 1 according to the present embodiment, both the height positions of the first main surface 30a and the second main surface 30b of the electronic component 30 are different from the height positions of the pair of main surfaces of the adjacent first conductor layers 13. By having such a configuration, in a case in which an external force is received such that a position shift occurs between the main surface on one side and the main surface on the other side along the main surface direction of the electronic component-incorporating substrate, even when an external force is propagated by the first conductor layer 13 as described above, a difference in height position can reduce an external force received by the electronic component 30. That is, when compared to a case in which the height positions of the pair of main surfaces (the first main surface 30a and the second main surface 30b) of the electronic component 30 are the same as the height positions of the pair of main surfaces of the adjacent first conductor layers 13, a propagation direction of an external force by the first conductor layer 13 can be made different from an extending direction of the pair of main surfaces of the electronic component 30. Therefore, it is possible to reduce the influence of the external force propagated by the first conductor layer 13 and received by the electronic component 30. Therefore, it is possible to inhibit the electronic component from being affected by the external force.

In addition, in the electronic component-incorporating substrate 1 according to the present embodiment, the electronic component 30 is stacked on the first main surface 11a of the first insulating layer 11 via the adhesive layer 40. Further, by having such a configuration, a height position of the lower surface of the first conductor layer 13 is different from the height position of the second main surface 30b of the electronic component 30. In this way, when the electronic component 30 is provided on the adhesive layer 40 on the first main surface 11a of the first insulating layer 11, it is possible to mitigate a force that causes a position shift between the first main surface 11a of the first insulating layer 11 and the main surface of the second insulating layer 12 facing the first main surface 11a by the adhesive layer 40. In addition, even when a force in the stacking direction of the electronic component 30 (the stacking direction of the electronic component-incorporating substrate 1) is applied to the electronic component 30 due to the external force, the adhesive layer 40 can mitigate the force. Therefore, the electronic component 30 can be further inhibited from being affected by the external force.

In addition, an effect that the influence of the external force can be suppressed in the electronic component 30 described above becomes remarkable when the thickness of the first conductor layer 13 is substantially uniform as in the electronic component-incorporating substrate 1. When the thickness of the first conductor layer 13 is substantially uniform, an external force propagating along the extending direction of the first conductor layer 13 is inhibited from dispersing in another direction. Therefore, there is a possibility that propagation to the electronic component 30 may occur while the magnitude of the external force is maintained by the first conductor layer 13. For this reason, in a case in which the thickness of the first conductor layer 13 is substantially uniform, when the height position of the main surface of the electronic component 30 is made different from the height positions of the pair of main surfaces of the adjacent first conductor layer 13, the effect that the influence of the external force propagated by the first conductor layer 13 and received by the electronic component 30 becomes remarkable.

An example in which the first main surface 11a of the electronic component 30 is higher than the upper surface of the first conductor layer 13 (on the third conductor layer 15 side), and the second main surface 11b of the electronic component 30 is higher than the lower surface of the first conductor layer 13 (the first main surface 11a of the first insulating layer) is shown in the electronic component-incorporating substrate 1 of the present embodiment. However, when the height position of the main surface of the electronic component 30 is different from the height positions of the pair of main surfaces of the adjacent first conductor layer 13, an effect that the influence of the external force received by the electronic component 30 is suppressed is obtained. Therefore, for example, even when the first main surface 11a of the electronic component 30 is lower than the upper surface of the main surface of the first conductor layer 13 (on the second conductor layer 14 side), the effect that the influence of the external force received by the electronic component 30 is suppressed is obtained.

In addition, when at least the height position of the first main surface 11a of the electronic component 30 and the height position of the upper surface of the adjacent first conductor layer 13 are different from each other, the effect that the influence of the external force received by the electronic component 30 is suppressed is obtained. That is, even when the height position of the second main surface 11b of the electronic component 30 is the same as the height position of the lower surface of the adjacent first conductor layer 13, since the height position of the first main surface 11a of the electronic component 30 is different from the height position of the upper surface of the adjacent first conductor layer 13, it is possible to suppress the influence of the external force received by the electronic component 30.

It is preferable that a difference between the height position of the first main surface 30a of the electronic component 30 and the height position of the main surface (upper surface) of the first conductor layer is 10 μm or less. As described above, since both the electronic component-incorporating substrate 1 and the electronic component 30 to be incorporated are significantly thin, when the difference between the height position of the first main surface 11a of the electronic component 30 and the height position of the main surface (upper surface) of the first conductor layer is large, the stress derived from the external force may concentrate on the electronic component 30. In addition, when the electronic component-incorporating substrate 1 is manufactured, the thickness of the second insulating layer 12 largely differs between an upper part of the electronic component 30 and the periphery thereof, and stress may concentrate on the electronic component 30. Therefore, by setting the difference between the height position of the first main surface 11a of the electronic component 30 and the height position of the main surface (upper surface) of the first conductor layer to 10 μm or less, concentration of stress on the electronic component 30 can be suppressed.

In addition, in a case in which the height position of the second main surface 30b of the electronic component 30 and the height position of the main surface (lower surface) of the first conductor layer are different from each other, a difference thereof is preferably 10 μm or less. In the case of adopting a configuration in which the height position of the second main surface 30b of the electronic component 30 is made largely different from the height position of the main surface (lower surface) of the first conductor layer, the stress derived from the external force may concentrate on the electronic component 30. Therefore, by setting the difference in height position to 10 μm or less, concentration of stress on the electronic component 30 can be suppressed.

(Modification)

Figure 6:
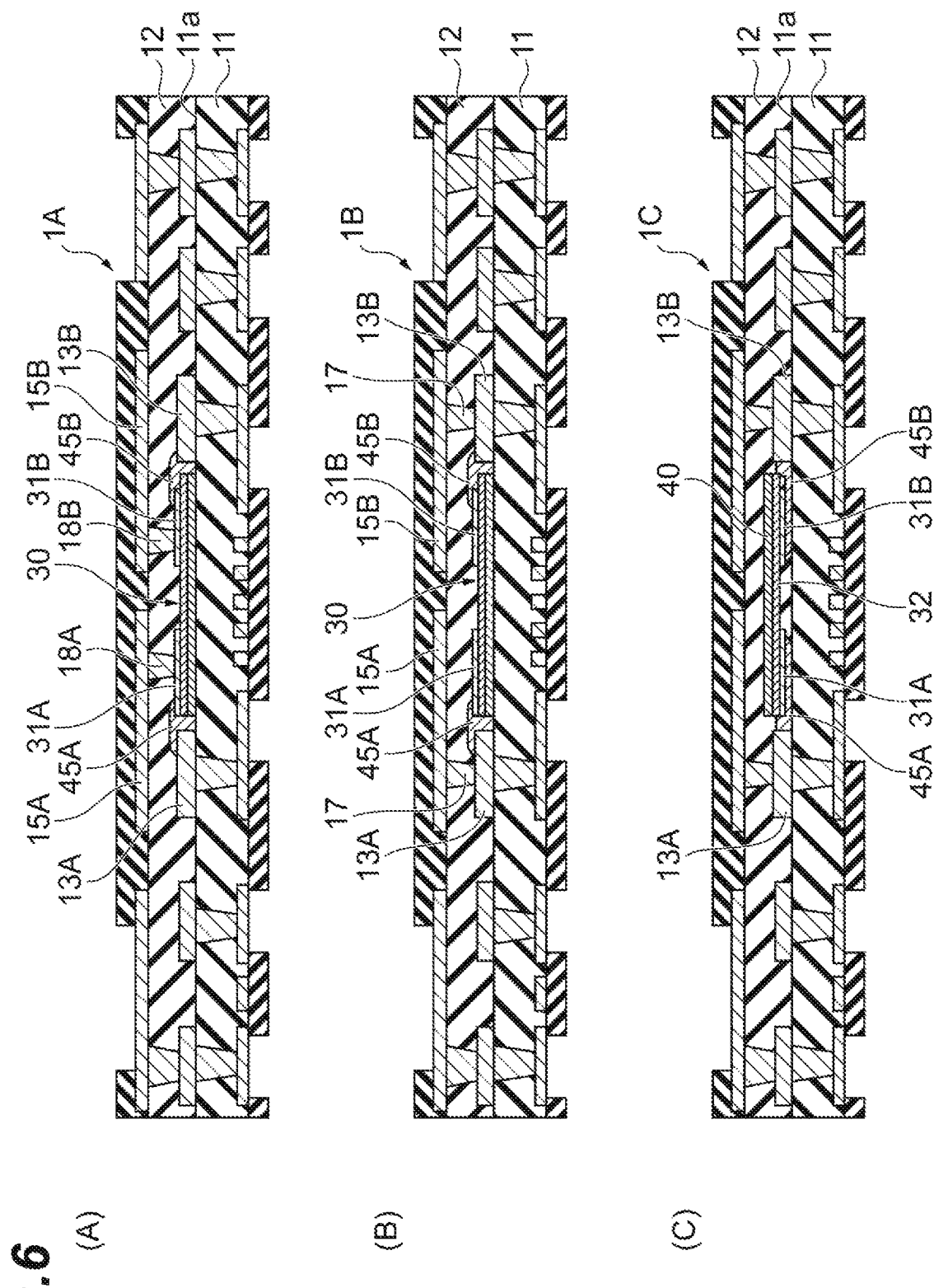
FIG. 6 is a cross-sectional view for description of an electronic component-incorporating substrate according to a modification.
Figure 7:
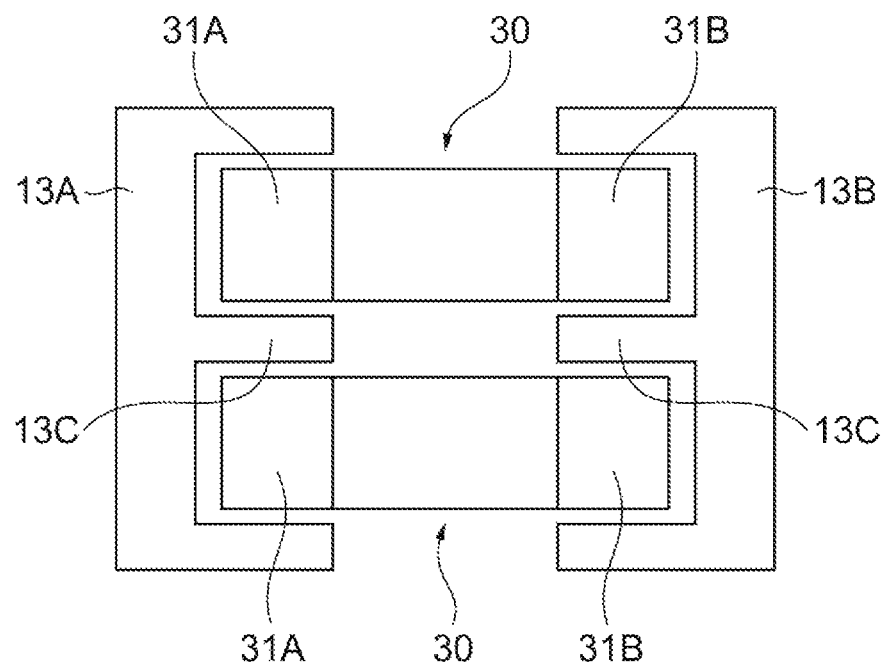
FIG. 7 is a plan view of a vicinity of an electronic component for description of the electronic component-incorporating substrate according to the modification.

Next, an electronic component-incorporating substrate according to a modification will be described with reference to FIG. 6 and FIG. 7. FIG. 6(A) to FIG. 6(C) correspond to examples of changing connection between the electronic component of the electronic component-incorporating substrate and another conductor layer, etc. In addition, FIG. 7 is a modification related to arrangement of the electronic component and the first conductor layer.

In an electronic component-incorporating substrate 1A illustrated in FIG. 6(A), the electrode layer of the electronic component 30 and the first conductor layer 13 are connected by a conductive paste. More specifically, a space between the first electrode layer 31A of the electronic component 30 and the conductor layer 13A of the first conductor layer 13 adjacent to the first electrode layer 31A side of the electronic component 30 is filled with a conductive paste 45A to connect therebetween. In addition, a space between the second electrode layer 31B of the electronic component 30 and the conductor layer 13B of the first conductor layer 13 adjacent to the second electrode layer 31B side of the electronic component 30 is filled with a conductive paste 45B to connect therebetween. The conductive pastes 45A and 45B are not particularly limited as long as the conductive pastes 45A and 45B have conductivity. For example, a material containing Sn (tin) as a main component can be used. The conductive pastes 45A and 45B are introduced such that the first conductor layer 13 is formed on the first main surface 11a of the first insulating layer 11, the electronic component 30 is disposed through the adhesive layer 40, and then the first conductor layer 13 (the conductor layer 13A or the conductor layer 13B) and the electrode layer (the first electrode layer 31A or the second electrode layer 21B) of the electronic component 30 are connected to each other.

In the case of a configuration in which the first conductor layer 13 (the conductor layer 13A or the conductor layer 13B) and the electrode layer (the first electrode layer 31A or the second electrode layer 21B) of the electronic component 30 are connected to each other by the conductive pastes 45A and 45B as in the electronic component-incorporating substrate 1A, it is possible to omit the via conductor that connects the conductor layer 13A and the conductor layer 15A, which is electrically connected to the first electrode layer 31A, in the third conductor layer 15 to each other. That is, while the via conductor 17 that connects the conductor layer 13A and the conductor layer 15A to each other is provided in the case of the electronic component-incorporating substrate 1 illustrated in FIG. 1, the via conductor 17 can be omitted in the electronic component-incorporating substrate 1A since the first electrode layer 31A and the conductor layer 13A are electrically connected to each other by the conductive paste 45A. Similarly, in the electronic component-incorporating substrate 1A, since the second electrode layer 31B and the conductor layer 13B are electrically connected to each other by the conductive paste 45B, the via conductor 17 that connects the conductor layer 13B and the conductor layer 15B to each other may be omitted. As described above, in the electronic component-incorporating substrate 1A, layout of wiring can be simplified using the conductive pastes 45A and 45B connecting the electrode layer of the electronic component 30 and the first conductor layer 13 to each other. Incidentally, in the electronic component-incorporating substrate 1A, layout of wiring is simplified. However, even when layout of wiring is not simplified, layout of wiring can be flexibly changed.

Similarly to the electronic component-incorporating substrate 1A illustrated in FIG. 6(A), in the electronic component-incorporating substrate 1B illustrated in FIG. 6(B), the electrode layer of the electronic component 30 and the first conductor layer 13 are electrically connected by the conductive pastes 45A and 45B. Furthermore, the electronic component-incorporating substrate 1B is not provided with the via conductor 18A that connects the first electrode layer 31A of the electronic component 30 and the conductor layer 15A of the third conductor layer 15 to each other and the via conductor 18B that connects the second electrode layer 31B and the conductor layer 15B of the third conductor layer 15 to each other. In the electronic component-incorporating substrate 1B, in place of the via conductors 18A and 18B, a via conductor 17 that connects the conductor layer 13A and the conductor layer 15A to each other and a via conductor 17 that connects the conductor layer 13B and the conductor layer 15B to each other are provided. Since the conductor layers 13A and 13B are connected to the first electrode layer 31A and the second electrode layer 31B by the conductive pastes 45A and 45B, respectively, when the conductor layers 13A and 13B and the conductor layers 15A and 15B are connected to each other, the first electrode layer 31A, the conductor layer 13A, and the conductor layer 15A can have the same potential, and the second electrode layer 31B, the conductor layer 13B, and the conductor layer 15B can have the same potential. Therefore, in the electronic component-incorporating substrate 1B, layout of wiring can be simplified using the conductive pastes 45A and 45B connecting the electrode layer of the electronic component 30 and the first conductor layer 13 to each other.

In addition, as in the electronic component-incorporating substrate 1B, by adopting a configuration in which the via conductors 18A and 18B electrically connected to the main surfaces of the first electrode layer 31A and the second electrode layer 31B of the electronic component 30 are not provided, it is possible to inhibit a force in the stacking direction of the electronic component 30 (stacking direction of the electronic component-incorporating substrate 1) from being applied to the electronic component 30 through the via conductors 18A and 18B when the electronic component-incorporating substrate 1B receives an external force. Therefore, it is possible to further inhibit an influence of the external force received by the electronic component 30.

In an electronic component-incorporating substrate 1C illustrated in FIG. 6(C), a vertical direction of the electronic component is reversed when compared to the electronic component-incorporating substrate 1B illustrated in FIG. 6(B). That is, the first electrode layer 31A and the second electrode layer 31B of the electronic component 30 are disposed on the first insulating layer 11 side of the dielectric layer 32. However, the main surface 11a of the first insulating layer 11 is separated from the first electrode layer 31A and the second electrode layer 31B of the electronic component 30, and the conductive paste 45A and the second insulating layer 12 are interposed between the main surface 11a of the first insulating layer 11 and the first electrode layer 31A. In addition, the conductive paste 45B and the second insulating layer 12 are interposed between the first main surface 11a of the first insulating layer 11 and the second electrode layer 31B. Further, the adhesive layer 40 is provided above the dielectric layer 32 (on the third conductor layer 15 side). However, the adhesive layer 40 may not be provided.

In the case of manufacturing the electronic component-incorporating substrate 1C, the first conductor layer 13 is formed on the first main surface 11a of the first insulating layer 11, and the conductive pastes 45A and 45B are disposed at predetermined positions. Thereafter, the electronic component 30 is disposed on the conductive pastes 45A and 45B. In addition, the adhesive layer 40 is disposed on the electronic component 30 as necessary.

Even when a top and a bottom of the electronic component 30 are reversed as in the electronic component-incorporating substrate 1C, the electrode layer of the electronic component 30 and the first conductor layer 13 are electrically connected by the conductive pastes 45A and 45B. In addition, by the via conductor 17 connecting the conductor layer 13A and the conductor layer 15A to each other and the via conductor 17 connecting the conductor layer 13B and the conductor layer 15B to each other, the first electrode layer 31A, the conductor layer 13A, and the conductor layer 15A have the same potential, and the second electrode layer 31B, the conductor layer 13B, and the conductor layer 15B have the same potential.

In addition, in the electronic component-incorporating substrate 1C, the conductive pastes 45A and 45B function as adhesive layers, and the electronic component 30 is separated from the first insulating layer 11 by the conductive pastes 45A and 45B. Therefore, similarly to the electronic component-incorporating substrates 1, 1A and 1B, the electronic component 30 is stacked on the first main surface 11a of the first insulating layer 11 via the adhesive layer, and the electronic component 30 is further inhibited from being affected by an external force.

FIG. 7 is a diagram illustrating an example of arrangement of the first conductor layer 13 in a case in which a plurality of electronic components 30 is provided, and is a plan view corresponding to FIG. 2. In the example illustrated in FIG. 7, similarly to the first conductor layer 13, two electronic components 30 are disposed on the first main surface 11a of the first insulating layer 11. In this instance, both the two electronic components 30 are spaced apart from the first conductor layer 13. In this instance, as illustrated in FIG. 2, the first conductor layer 13 (conductor layers 13A and 13B) is provided to surround and be spaced apart from the first electrode layer 31A, the second electrode layer 31B, and the dielectric layer 32 of each of the two electronic components 30. In the electronic component-incorporating substrate, since the second insulating layer 12 is disposed between the electronic component 30 and the first conductor layer 13, insulation is ensured between the electronic component 30 and the first conductor layer 13.

In addition, each first conductor layer 13 (conductor layers 13A and 13B) illustrated in FIG. 7 has a protrusion 13C protruding between adjacent electronic components 30. In the case of having such a shape, when the first conductor layer 13 is provided around each of the two electronic components 30, the two electronic components 30 can be prevented from coming into contact with each other in a case in which the electronic component-incorporating substrate receives a large external force. In addition, since the shape of the first conductor layer 13 can be used as a reference for arrangement of the electronic component 30 at the time of manufacturing the electronic component-incorporating substrate, it is considered to contribute to improvement of manufacturing efficiency.

Even though the embodiment of the invention has been described above, the invention is not limited to the embodiment, and various changes can be made.

For example, shapes and arrangement of the electronic component 30, the via conductors 16, 17, 18A, and 18B, etc. included in the electronic component-incorporating substrate 1 can be appropriately changed. In addition, shapes of the first conductor layer 13, the second conductor layer 14, and the third conductor layer 15 can be appropriately changed. In addition, the second conductor layer 14 and the third conductor layer 15 may not be provided, and only one of the conductor layers may be provided. In addition, shapes of the insulating materials 21 and 22 may be appropriately changed, and the insulating materials 21 and 22 may not be provided.

In addition, in the embodiment, a description has been given of a case in which the insulating layer corresponds to two layers of the first insulating layer 11 and the second insulating layer 12. However, the insulating layer may correspond to three or more layers. Even when the insulating layer corresponds to three or more layers, in the case of a configuration in which the electronic component and the conductor layer are provided between two insulating layers, the electronic component can be inhibited from receiving an external force by having a configuration described in the present embodiment, that is, a configuration the height positions of the main surface of the conductor layer and the main surface of the electronic component are different from each other.

FIG. 8 to FIG. 11 illustrate an embodiment related to a package substrate obtained by combining the electronic component-incorporating substrate of the invention with an IC-incorporating substrate.

Figure 8:
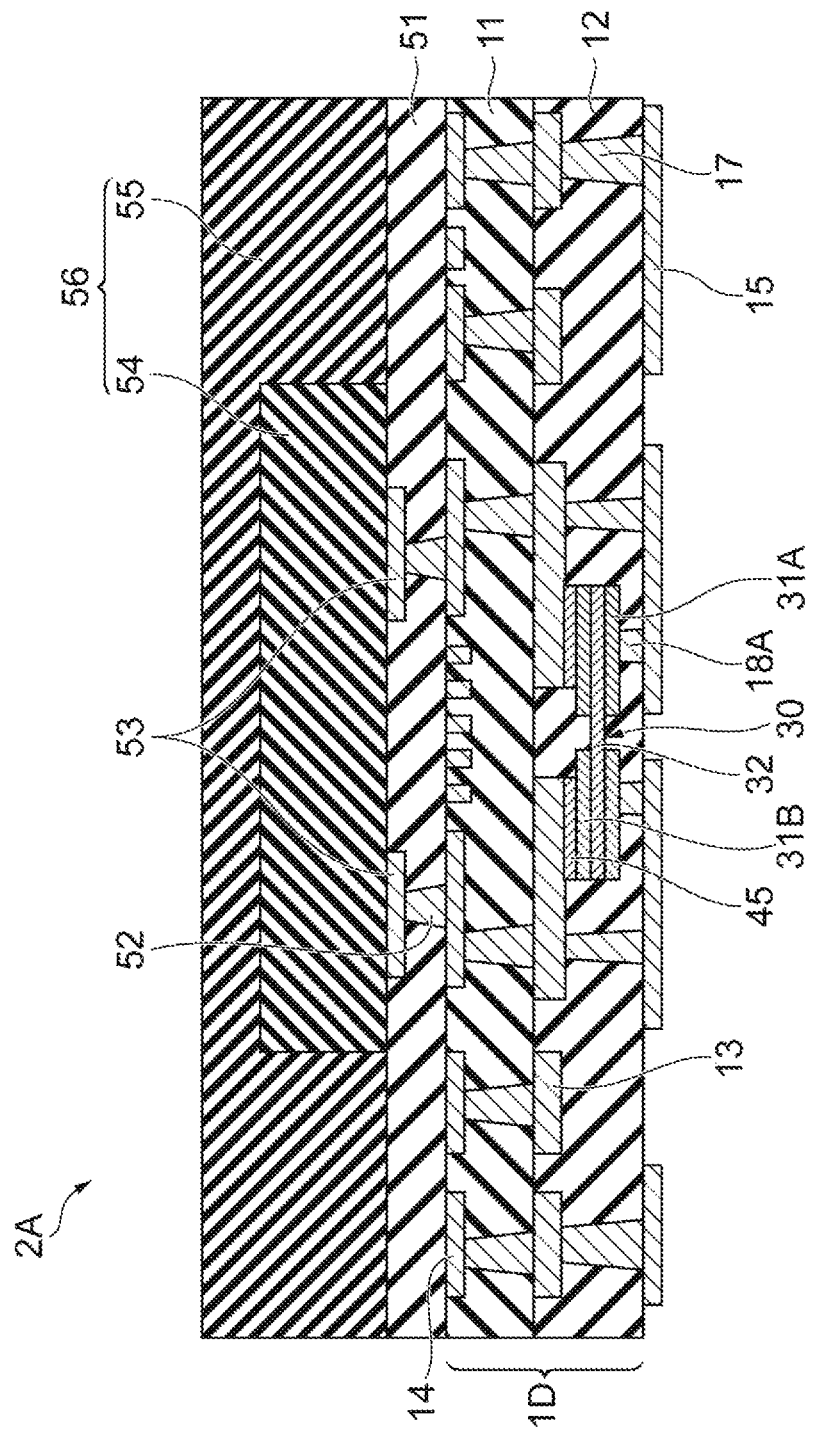
FIG. 8 is a cross-sectional view of a package substrate in which an electronic component-incorporating substrate and an IC-incorporating substrate are combined according to an embodiment of the present invention.

FIG. 8 is a cross-sectional view schematically illustrating a package substrate 2A obtained by connecting an IC-incorporating substrate 56 in which an IC 54 is incorporated in an insulating layer 55 to an electronic component-incorporating substrate 1D according to an embodiment of the invention through a third insulating layer 51.

The electronic component-incorporating substrate 1D has the same schematic structure as that of the electronic component-incorporating substrate 1, etc. However, a structure of the electronic component 30 is provided such that the first electrode layer 31A and the second electrode layer 31B interpose the dielectric layer 32 therebetween. In addition, the insulating materials 21 and 22 have been removed. Furthermore, the electronic component-incorporating substrate 1D is in a state in which a top and a bottom are reversed. That is, the third insulating layer 51 and the IC-incorporating substrate 56 are stacked on the second conductor layer 14 side.

The electronic component-incorporating substrate 1D and the IC-incorporating substrate 56 can be electrically connected through a via conductor 52 and a conductor layer 53 for connection provided in the third insulating layer 51. However, it is possible to appropriately change shapes, arrangement, etc. of the conductor layer and the via conductor electrically connecting the conductor layer and the IC 54 to each other in the electronic component-incorporating substrate 1D. Therefore, it is possible to provide a wiring layer, etc. different from the conductor layer 53.

For example, the package substrate 2A illustrated in FIG. 8 can be manufactured using the following method. First, the IC-incorporating substrate 56 is manufactured by embedding the IC 54 in the insulating layer 55. In this instance, after the IC 54 is exposed on a surface of the insulating layer 55, the surface (surface corresponding to a lower surface side of the IC-incorporating substrate 56) is made flat. Thereafter, after the conductor layer 53 is formed on the surface on which the IC 54 is exposed, the third insulating layer 51 is provided, and the via conductor 52 is formed inside. Thereafter, the package substrate 2A can be obtained by forming each part of the electronic component-incorporating substrate 1D. Incidentally, the IC-incorporating substrate 56 may be manufactured by a procedure of forming the conductor layer 53 for rewiring on the surface of the IC 54 in advance by a semiconductor process, etc. and then embedding the conductor layer 53 in the insulating layer 55.

In the case of a structure of the package substrate 2A combined with the IC-incorporating substrate as in FIG. 8, it is possible to further effectively inhibit the electronic component 30 from being affected by the external force.

Figure 9:
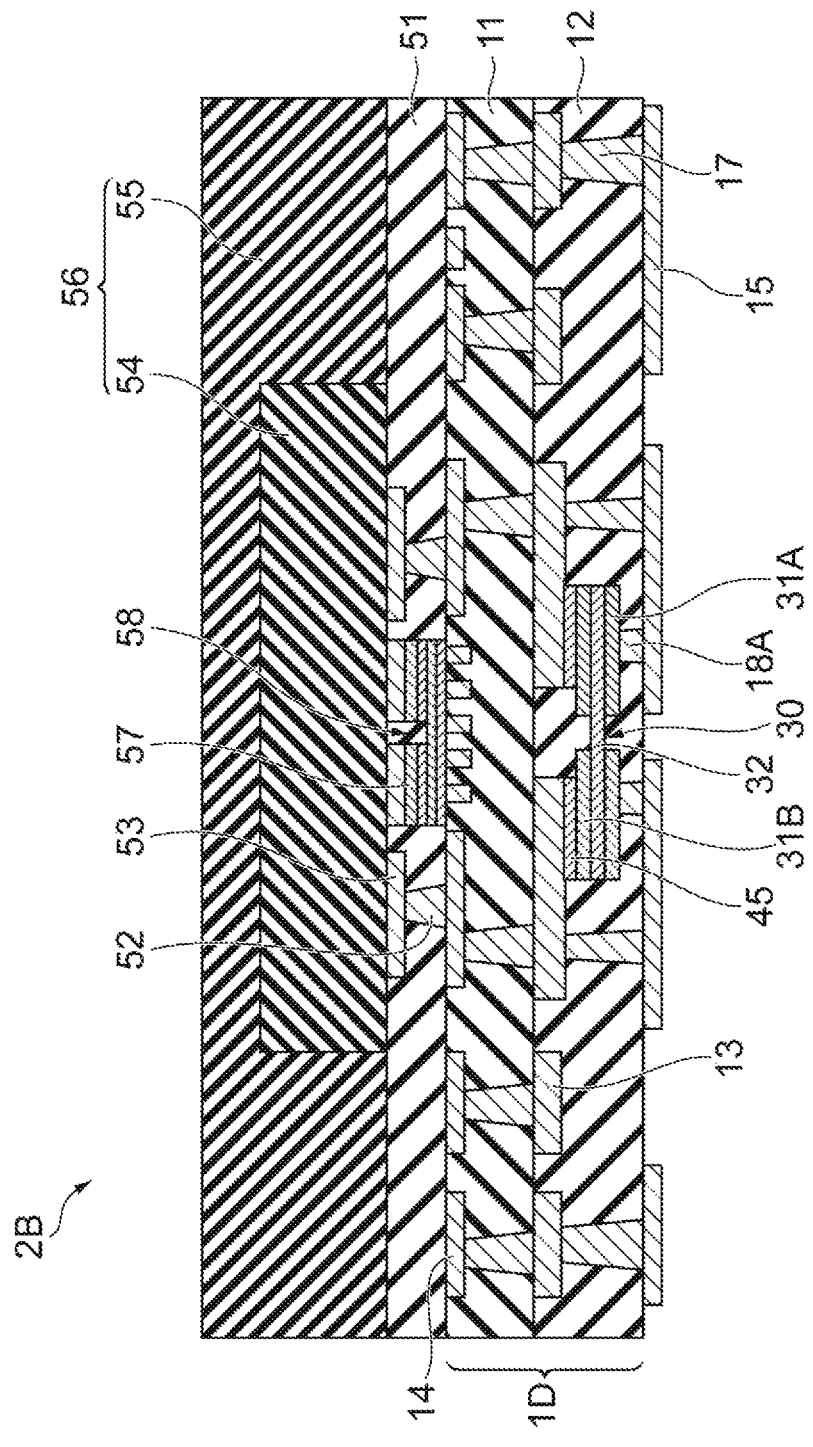
FIG. 9 is a cross-sectional view of a modification of the package substrate.

FIG. 9 illustrates a package substrate 2B obtained by adding an electronic component 58 to the package substrate 2A. In the package substrate 2B, the electronic component 58 directly connected to the IC 54 is provided in the third insulating layer 51. The electronic component 58 may have a similar structure to that of the electronic component 30 in which the pair of electrode layers interposes the dielectric layer therebetween, and is not particularly limited. The electronic component 58 may be electrically connected to the IC 54 via a conductive material 57. As in the package substrate 2B illustrated in FIG. 9, the electronic component 58 different from the electronic component 30 in the electronic component-incorporating substrate 1D is provided in the third insulating layer 51 provided between the IC-incorporating substrate 56 and the electronic component-incorporating substrate 1D. As described above, a secondary effect that a power supply to the IC 23 is more stabilized is obtained by combining the electronic component 30 and the electronic component 58.

Figure 10:
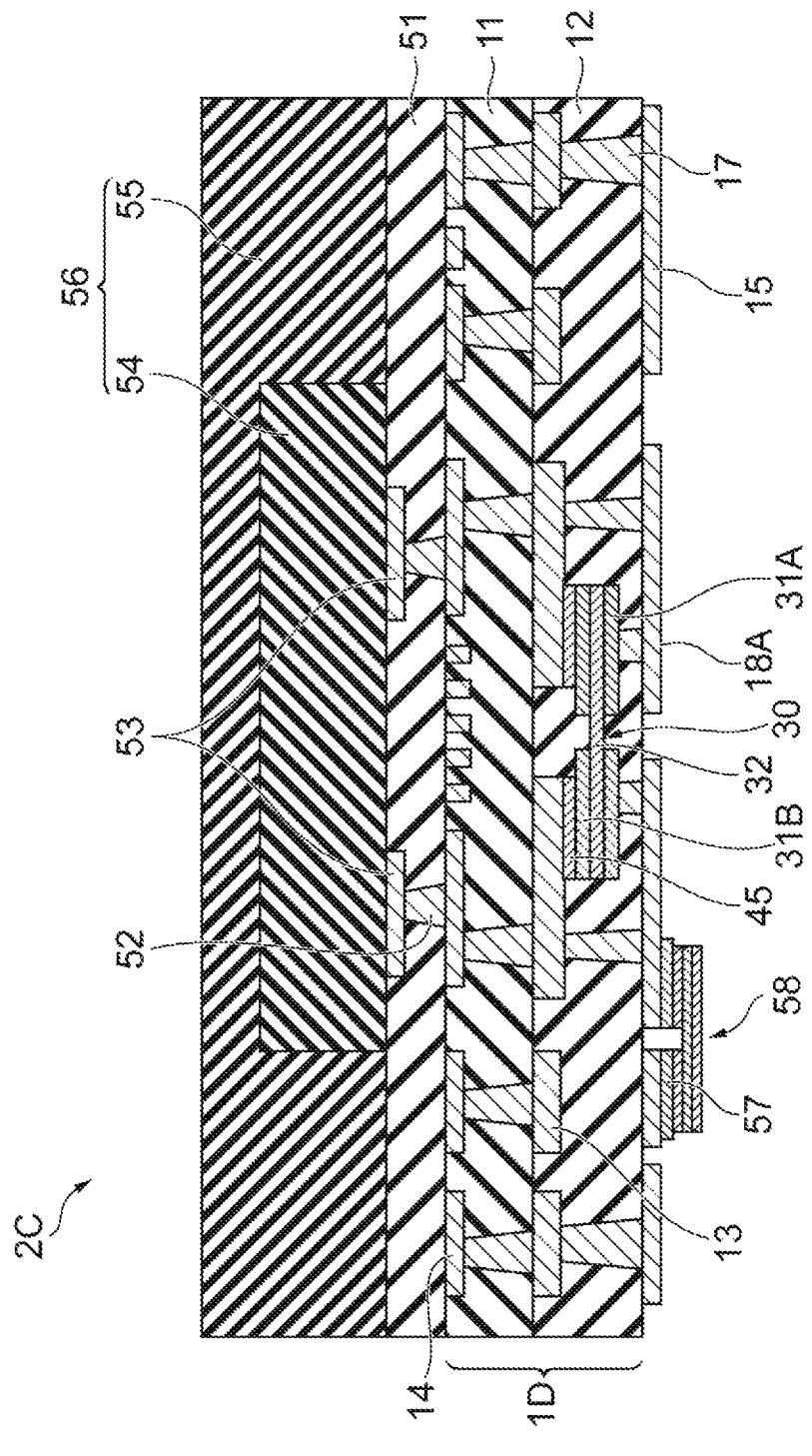
FIG. 10 is a cross-sectional view of a modification of the package substrate.

FIG. 10 illustrates a package substrate 2C obtained by adding the electronic component 58 to the package substrate 2A. In the package substrate 2C, an example is shown in which the electronic component 58 is electrically connected to the third conductor layer 15 outside in an outside attachment state. When the electronic component 58 is attached, the conductive material 57 may be provided as needed. As in the package substrate 2C illustrated in FIG. 10, it is possible to adopt a structure in which the electronic component 58 different from the electronic component 30 in the electronic component-incorporating substrate 1D is externally attached.

Figure 11:
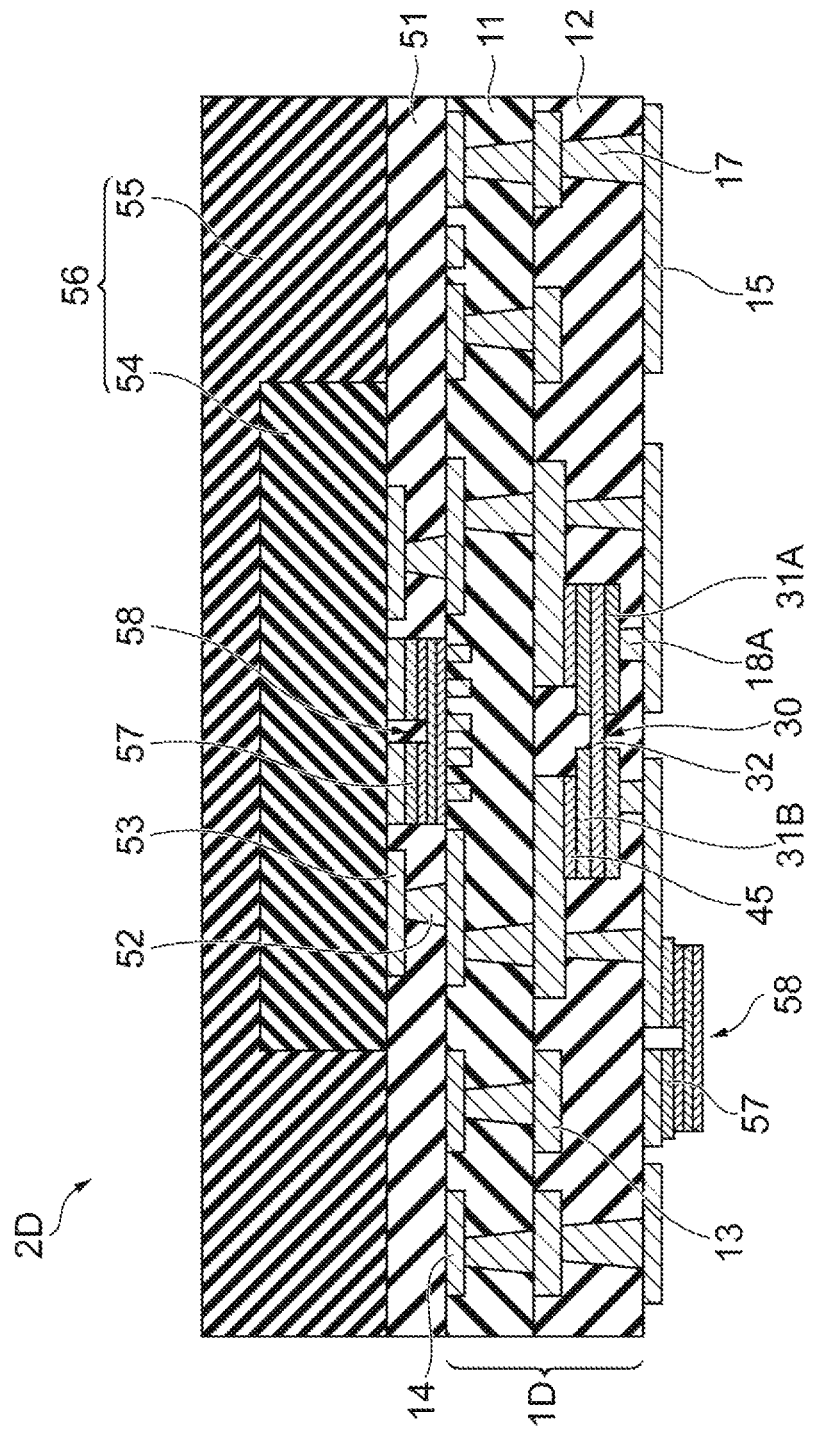
FIG. 11 is a cross-sectional view of a modification of the package substrate.

FIG. 11 illustrates a package substrate 2D in which the package substrate 2B illustrated in FIG. 9 and the package substrate 2C illustrated in FIG. 10 are combined. That is, the electronic component 58 different from the electronic component 30 in the electronic component-incorporating substrate 1D is provided both in the third insulating layer 51 and on the outside of the third conductor layer 15. As described above, the number, arrangement, etc. of the electronic components included in the package substrate 2D can be changed as appropriate.

REFERENCE SIGNS LIST 1, 1A to 1C: electronic component-incorporating substrate, 2A to 2D: package substrate, 10: substrate, 11: first insulating layer, 12: second insulating layer, 13: first conductor layer, 14: second conductor layer, 15: third conductor layer, 16, 17, 18A, 18B: via conductor, 21, 22: insulating material, 30, 50: electronic component, 31A: first electrode layer, 31B: second electrode layer, 40: adhesive layer, 51: third insulating layer, 54: IC, 56: IC-incorporating substrate, 58: electronic component.

The invention claimed is:
1. An electronic component-incorporating substrate comprising:
a first insulating layer;
a conductor layer on a first main surface of the first insulating layer in a stacking direction;

an electronic component (1) on the first main surface of the first insulating layer in the stacking direction and (2) comprising a pair of electrode layers and a dielectric layer; and a second insulating layer on the first insulating layer in the stacking direction, wherein:

the pair of electrode layers are stacked on the dielectric layer in the stacking direction; and a height of an upper main surface of the electronic component in the stacking direction is different from a height of an upper main surface of the conductor layer adjacent to the electronic component in the stacking direction.

2. The electronic component-incorporating substrate according to claim 1, wherein the electronic component is attached to the first main surface of the first insulating layer by an adhesive layer between the electronic component and the first main surface of the first insulating layer.

3. The electronic component-incorporating substrate according to claim 1, wherein a height of a lower main surface of the electronic component in the stacking direction is different from a height of a lower main surface of the conductor layer adjacent to the electronic component in the stacking direction.

4. The electronic component-incorporating substrate according to claim 1, wherein a thickness of the conductor layer is substantially uniform.

5. The electronic component-incorporating substrate according to claim 1, wherein a part of the electrode layer of the electronic component is connected to the conductor layer by a conductive paste.

6. The electronic component-incorporating substrate according to claim 1, wherein the pair of electrode layers are spaced apart laterally on the dielectric layer.

* * * * *